(12) United States Patent
Shearman et al.

(10) Patent No.: US 10,440,852 B1
(45) Date of Patent: Oct. 8, 2019

(54) CABLE MANAGEMENT SYSTEM IN AN AIR-COOLED HOUSING

(71) Applicant: Ciena Corporation, Hanover, MD (US)

(72) Inventors: Simon John Shearman, Almonte (CA); Jacques Cote, Nepean (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/254,894

(22) Filed: Jan. 23, 2019

(51) Int. Cl.
 *H05K 5/00* (2006.01)
 *H05K 7/14* (2006.01)
 *H05K 7/20* (2006.01)

(52) U.S. Cl.
 CPC ....... *H05K 7/1491* (2013.01); *H05K 7/20709* (2013.01)

(58) Field of Classification Search
 CPC ....................................................... H05K 5/00
 See application file for complete search history.

(56) References Cited

U.S. PATENT DOCUMENTS

| | | |
|---|---|---|
| 6,426,876 B1 | 7/2002 | Shearman et al. |
| 6,466,724 B1 | 10/2002 | Glover et al. |
| 6,948,968 B1 | 9/2005 | Shearman et al. |
| 7,042,716 B2 | 5/2006 | Shearman |
| 7,043,130 B2 | 5/2006 | Ng et al. |
| 7,145,773 B2 | 12/2006 | Shearman et al. |
| 8,923,013 B2 * | 12/2014 | Anderson ............ G02B 6/4452 361/801 |
| 10,291,969 B2 * | 5/2019 | Takeuchi ................. H04Q 1/02 |
| 2005/0074990 A1 | 4/2005 | Shearman et al. |
| 2005/0075001 A1 | 4/2005 | Shearman et al. |
| 2006/0045457 A1 | 3/2006 | Ng et al. |
| 2011/0222241 A1 | 9/2011 | Shearman et al. |
| 2015/0139223 A1 | 5/2015 | Mayenburg et al. |

* cited by examiner

*Primary Examiner* — Jerry Wu
(74) *Attorney, Agent, or Firm* — Clements Bernard Walker PLLC; Christopher L. Bernard; Lawrence A. Baratta, Jr.

(57) ABSTRACT

Systems and method for managing cables in a front-to-rear air-cooled housing of a networking system are provided, whereby airflow is controlled to flow through an air filter. According to one embodiment, a network element configured as a cable gate includes a brush and a frame having at least one slot. Each slot is configured to join an interior space of a housing with an exterior space outside the housing. The brush has bristles covering, in an unbiased condition, the at least one slot to reduce air flow between the interior space and the exterior space. The bristles are configured to be displaceable to enable cables to extend through the at least one slot.

12 Claims, 13 Drawing Sheets

CABLE MANAGEMENT SYSTEM IN AN AIR-COOLED HOUSING

FIELD OF THE DISCLOSURE

The present disclosure generally relates to computer and/or networking hardware. More particularly, the present disclosure relates to systems and methods for managing cables exiting an air-cooled housing.

BACKGROUND OF THE DISCLOSURE

Computer and/or networking systems, such as those used in data center environments or central office environments, often utilize rectangular-shaped metal boxes or cases for housing computer equipment. These cases are often stacked on shelves, racks, or cabinets in a relatively small area, whereby network equipment, such as routers, firewalls, servers, and other computer equipment, can communicate with each via bundles of cables. One issue that arises in these environments is that these systems often generate enough heat to damage sensitive electronic components. Thus, the boxes or housings often include one or more fans and/or other associated air flow components for moving air through the devices, thereby air-cooling the components to prevent overheating.

With air flowing through these housings, it is often desirable to also address the issue of exposing the electronic components to large amounts of dust. Since dust can affect the functionality of this equipment, it is often desirable to include air-filtration systems for filtering the air that is moved throughout the structures.

In addition to air-flow and air-filtering concerns, it may be beneficial to design the boxes for housing this networking equipment such that the boxes can be used in both a data center environment and a central office environment. However, air-flow and air-filtering systems are typically different in these two environments. For example, data center equipment may be used in clean rooms that do not require air filtering at the box or rack level. In some cases, air filtering can be done at a cabinet level with air filtering on the whole front surface of the cabinet. This requires the equipment to be placed in a cabinet and excludes the use of open frames. In a central office environment, it may be desirable to seal the system at a shelf level in a type of frame where the computer apparatus is configurable/removable to allow various combinations of components to be used when needed.

Front-to-rear air-cooled boxes with perforated faceplates for air inlet can be filtered at the perforation location if there are no removable cards. Otherwise, small air filters need to be provided for every card. The frame of an air filter may also pose a problem because it can block most of the card air inlet if it is placed at a card level.

Traditional central office type boxes may have air flow with a front bottom inlet and a top rear exhaust, which allows air entering at the bottom of the box to be filtered by a horizontally oriented air filter. Cables of such a system can be inserted through a front surface of the box and do not interfere with the air path. Central office equipment requires air filtering to be compliant with Network Equipment Building System (NEBS) standards.

A front-to-rear air flow system that moves air from a front of the box to the rear of the box often includes an air filter near the front of the box. However, since these networking systems are typically configured such that cables exit through the front of these boxes, another issue arises in which air is filtered where the cables would normally exit.

Therefore, there is a need for boxes or housing having front-to-rear cooled systems which can be used in both central office and data center environments, which include proper air filtering for NEBS compliance, and whereby the cable exit paths do not interfere with the location of air flow and air filtering systems.

BRIEF SUMMARY OF THE DISCLOSURE

According to various embodiments of the present disclosure, systems for managing cables in a networking system may be incorporated in air-cooled housings. In an embodiment, a system for managing cables includes a housing configured to support equipment and having an air-cooling apparatus for cooling the equipment; and at least one cable gate at a front portion of the housing, each of the at least one cable gate including a frame having at least one slot joining an interior space of the housing with an exterior space located outside the housing, each of the at least one cable gate including at least one brush having a plurality of bristles; wherein, in a blocking condition, the bristles of each cable gate are configured to cover the at least one slot of the respective cable gate to reduce air flow between the interior space and exterior space through the at least one slot; and wherein, in a displaced condition, the bristles of each cable gate are configured to allow one or more cables to protrude through one or more slots of the at least one slot of the respective cable gate to enable the equipment to be connected with external devices.

The system can further include a front cover configured to be installed at a front portion of the housing, wherein the front cover includes a vertical panel, a top extension, and a bottom extension, the top extension configured to extend in a rearward direction from a top edge of the vertical panel, and the bottom extension configured to extend in the rearward direction from a bottom edge of the vertical panel. The frame of the at least one cable gate can include one of a top brush and a bottom brush. In the displaced condition, a combinations of the one or more cables and the bristles can be collectively configured to reduce air flow between the interior space and exterior space through the at least one slot. Each cable gate can include at least one brush brace connected to the frame, each brush brace configured to support a respective brush. The housing can be mounted on a shelf of a networking system.

The housing can include a front-to-rear air cooling system. The housing can be a pizza-box type housing. The housing can be configured to support removeable circuit packs having input and outputs for connection with a first end of the cables, the cables extending through the slots such that a second end of the cables is connectable to equipment external to the housing. The system can be configured for installation in a data center setting and a central office setting. The front cover can include a plurality of perforations in the vertical panel. The front cover can further include an air filter connected to an inside surface of the vertical panel to filter air flowing through the perforations.

In another embodiment, a cable gate includes a frame having at least one slot, each slot configured to join an interior space of a housing with an exterior space outside the housing; and a brush having bristles covering, in an unbiased condition, the at least one slot to reduce air flow between the interior space and the exterior space; wherein the bristles are configured to be displaceable to enable cables to extend through the at least one slot. The cable gate can further include a brush head configured to support the bristles in a horizontal orientation across exterior edges of the frame.

The frame can include a vertical strip, horizontal strips, and vertical segments, a first end of each of the horizontal strips connected to the vertical strip and a bottom end of each of the vertical segments connected to a second end of the horizontal strips.

A gap can be formed between a top end of each of the vertical segments and a horizontal strip positioned above the respective vertical segment to create a break-away feature. The cable gate can further include a center fixture connected to the vertical strip of the frame, the center fixture configured for removably attaching the cable gate to a front edge of the housing. The cable gate can further include a brush brace connected to the frame, the brush brace configured to removably support a brush head of the brush, the brush head configured to support the bristles in a horizontal orientation.

In a further embodiment, a method of connecting a cable management apparatus to a housing includes the steps of: connecting at least one cable gate to a front portion of an air-cooled housing, each cable gate including a slot and a brush, the slot configured to join an interior space of the air-cooled housing with an exterior space outside the air-cooled housing, the brush having a plurality of bristles configured, in a blocking condition, to cover the slot to reduce air flow between the interior space and the exterior space and configured, in a displaced condition, to enable one or more cables to extend through the slot; and connecting a front cover to the air-cooled housing, the front cover comprising a plurality of perforations and an air filter for filtering air passing through the perforations. The method can further include the step of connecting the front cover to the at least one cable gate.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

In various embodiments, the present disclosure relates to systems and methods for managing cables that extend from inside an air-cooled housing to outside the air-cooled housing. The cables may be connected to computer and/or networking equipment installed within the air-cooled housing at one end of the cables and may be connected to other electronic equipment outside of the housing. According to the various embodiments of the present disclosure, the cables may extend through one or more cable gates. The cable gates are components attached to the air-cooled housing and configured to form part of an enclosure for the computer and/or networking equipment. In particular, the cable gates may include brush elements having bristles that are configured to cover up slots in the cable gates when the slots are not being used to pass the cables, but are further configured to be displaced in such a manner to allow cables to pass through the slots for connecting the internal equipment with other equipment located outside the enclosure.

Figure 1:
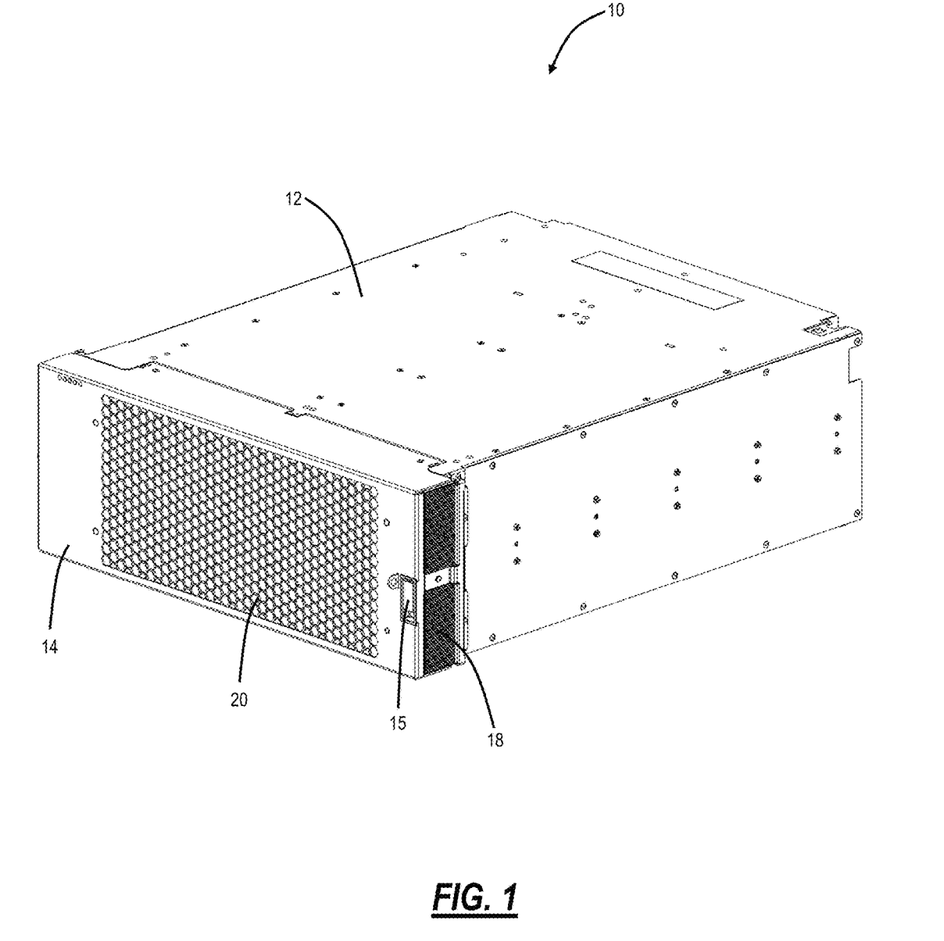
FIG. 1 is a diagram illustrating an isometric view of an enclosure for managing cables which exit an air-cooled housing, according to various embodiments of the present disclosure.
Figure 2:
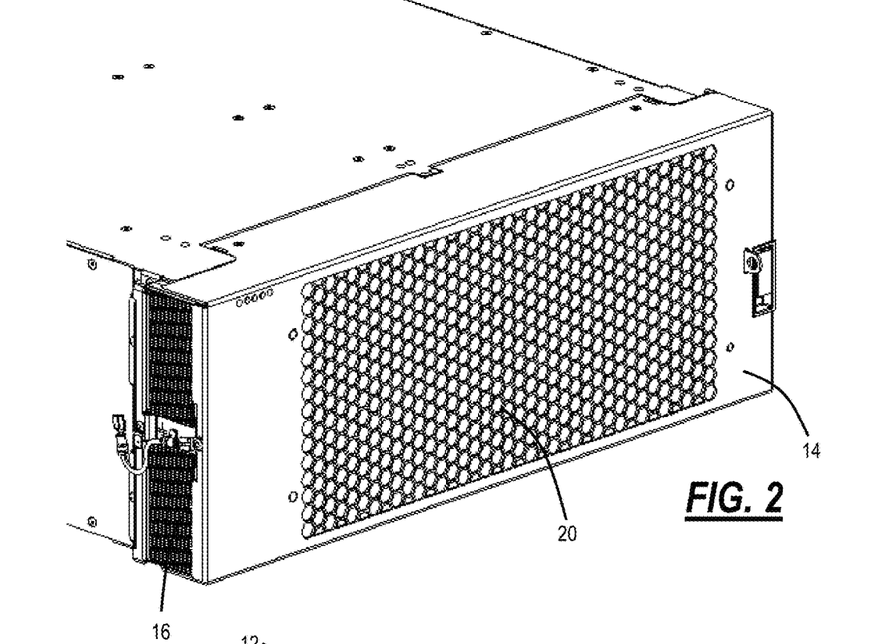
FIG. 2 is a diagram illustrating a partial view of a front left portion of the enclosure of FIG. 1.
Figure 3:
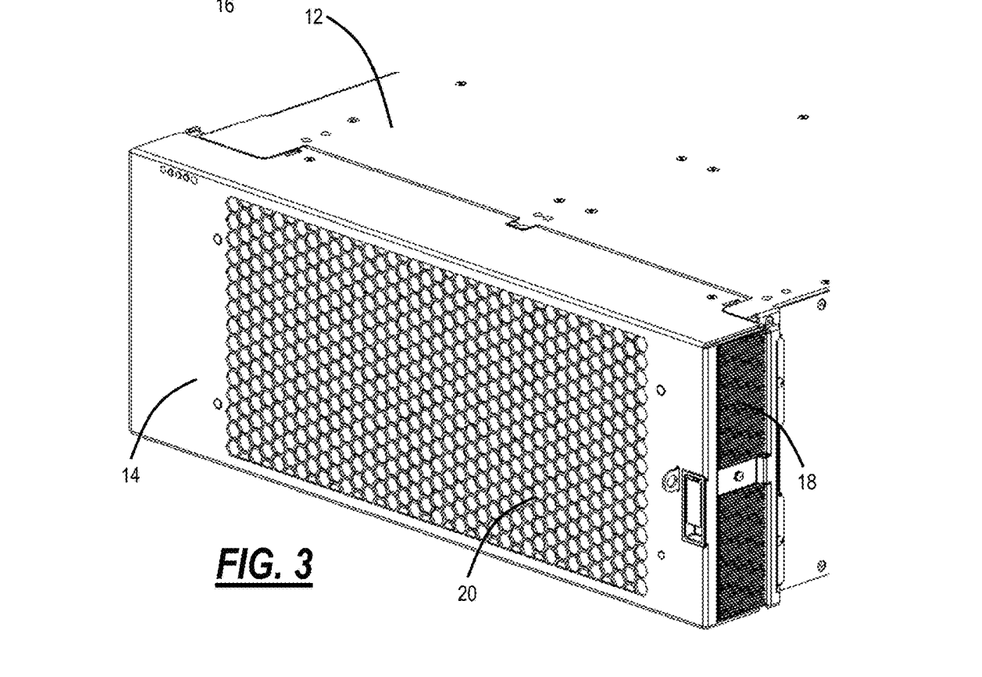
FIG. 3 is a diagram illustrating a partial view of a front right portion of the enclosure of FIG. 1.
Figure 17:
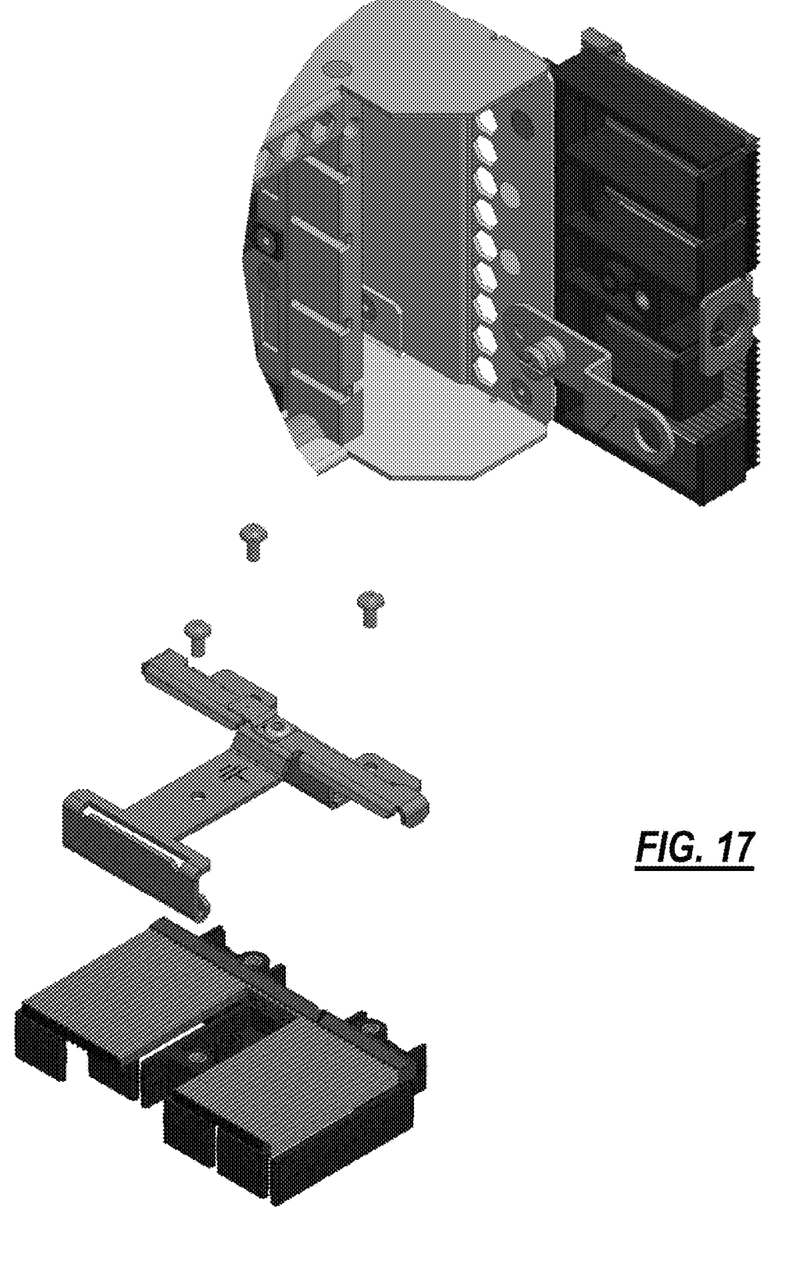
FIG. 17 is diagram illustrating a 2 Rack Unit (RU) embodiment of the cable gate, according to various embodiments.

FIG. 1 is an isometric view of an embodiment of an enclosure 10 that is configured as a front-to-rear cooling box for network computing equipment. FIG. 2 is a partial view of a front left portion of the enclosure 10 and FIG. 3 is a partial view of a front right portion of the enclosure 10. The enclosure 10 is configured to house equipment, such as networking components that may be used in a data center or central office. Generally, the enclosure 10 includes a housing 12, a front cover 14, a left cable gate 16, and a right cable gate 18. The housing 12 may include a substantially rectangular box and in some embodiments the housing 12 may include a pizza-box type shape which is a self-contained unit. In an embodiment, the housing 12 may be 1 to 4 Rack Units (RU) in height, which requires front-to-rear air cooling. That is, larger sizes in terms of RU have more flexibility in terms of air cooling and more specifically placement of the air filter. For example, various FIGS. described herein reference a 4 RU embodiment. FIG. 17 is a diagram of a 2 RU embodiment of the cable gate. Of course, other sizes are also contemplated.

The cable gates 16, 18, as described in more detail below, allow cables to pass through from an interior of the enclosure 10 to an exterior of the enclosure 10. When cables are not passing through the cable gates 16, 18, the cable gates 16, 18 are configured to cover up the openings between the interior and exterior to prevent or minimize the amount of air that flows through the cable gates 16, 18. Thus, the majority of the air being received into the enclosure 10 for front-to-rear air cooling passes through perforations 20 in the front cover 14.

Figure 4:
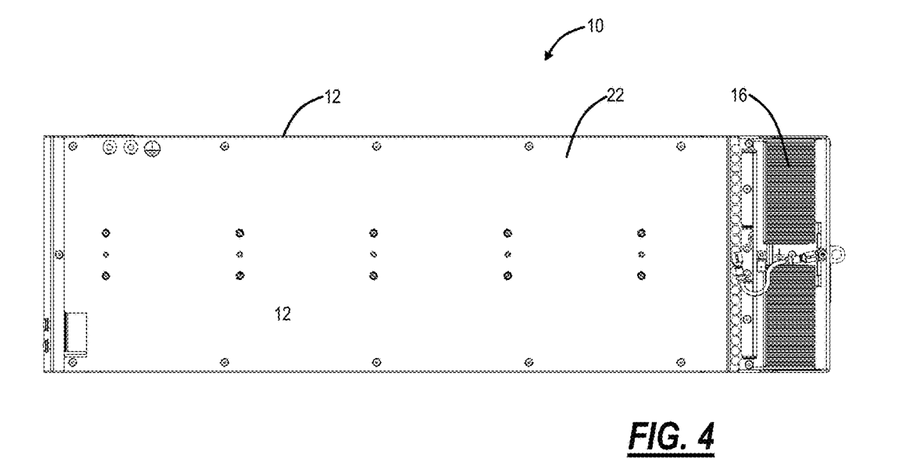
FIG. 4 is a diagram illustrating a side view of a left panel of the enclosure of FIG. 1, according to various embodiments.
Figure 5:
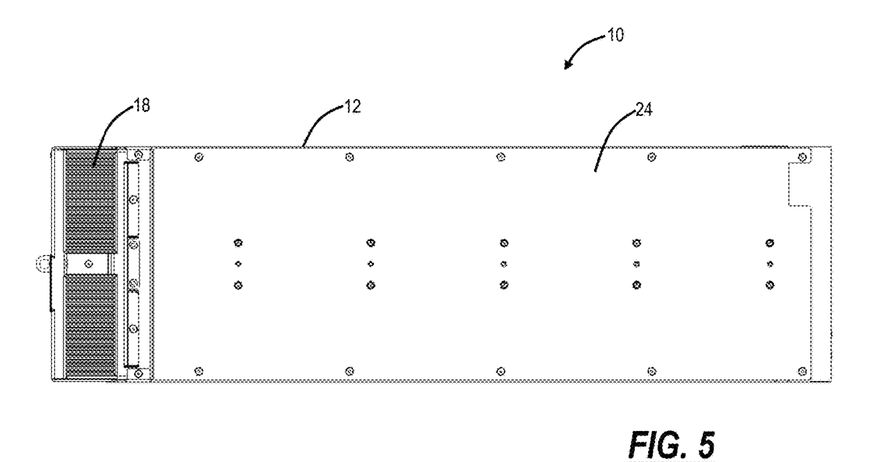
FIG. 5 is a diagram illustrating a side view of a right panel of the enclosure of FIG. 1, according to various embodiments.

FIG. 4 is a side view of the enclosure 10 showing a left side panel 22 of the housing 12. The left cable gate 16 is attached to a front edge of the housing 12 and extends in a forward direction (towards a right side of the drawing) from the left side panel 22. Similarly, FIG. 5 is a side view of the enclosure 10 showing a right side panel 24 of the housing 12. The right cable gate 18 is attached to the front edge of the housing 12 and extends in a forward direction (towards a left side of the drawing) from the right side panel 24.

Figure 6:
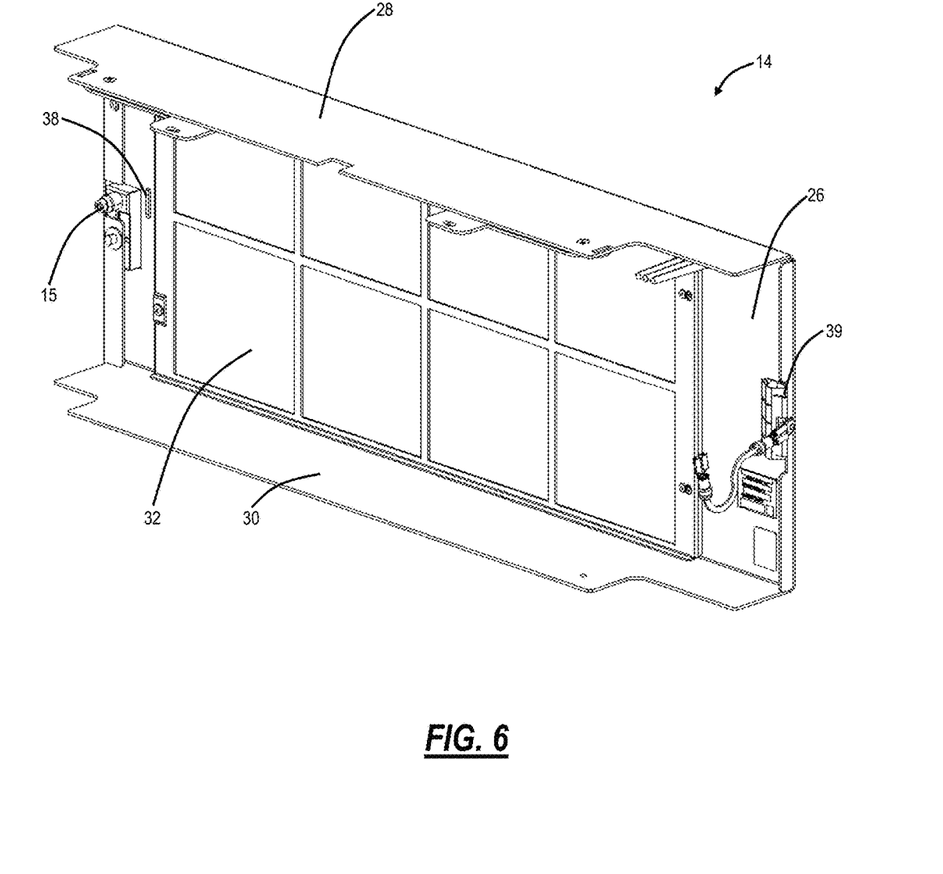
FIG. 6 is a diagram illustrating a rear view of a front cover shown in FIG. 1, according to various embodiments.

FIG. 6 is an isometric rear view of the front cover 14 according to one embodiment, where the front cover 14 has been removed from the housing 12. Generally, the front cover 14 includes a vertical panel 26, a top extension 28, and a bottom extension 30. The top extension 28 and bottom extension 30 may be configured as solid pieces without opening for allowing to flow therethrough. Instead, the front cover 14 is configured such that air is intended to flow primarily through the perforations 20 shown in FIGS. 1-3.

The top extension 28 may be connected to a top part of the vertical panel 26 and extends toward a rearward direction from the vertical panel 26. The bottom extension 30 may be connected to a bottom part of the vertical panel 26 and extends toward the rearward direction from the vertical panel 26. The vertical panel 26, top extension 28, and bottom extension 30 may be formed from a single metal sheet and folded such that the top extension 28 and bottom extension 30 are angled perpendicular to the vertical panel 26.

One or more air filters 32 may be connected to the inside surface of the vertical panel 26 to filter air that is received through the perforations 20. The air filter 32 may be connected to the vertical panel 26 using screws, clips, or other suitable connection components.

When connected, the top extension 28 is configured to extend outward in a forward direction from a top front edge of the housing 12 and the bottom extension 30 is configured to extend outward in a forward direction from a bottom front edge of the housing 12.

The front cover 14 may also include features to enable the front cover 14 to be connected with the left cable gate 16 and right cable gate 18. According to some embodiments, the front cover 14 may include an aperture 38 having an elongated shape. An associated tab (described below) on the right cable gate 18 may be inserted through the elongated aperture 38. Also, the front cover 14 may include a cover hook 39 which engages into a gate mounted slot 94 (FIG. 8) on one side, paired with a latch 15 which engages on gate mounted hole 103 on the opposite side. With the cover closed and latched the extension arm 102 will pass through slot 38. A pad lock can then pass through hole 104 on extension arm 102 to lock the cover in place.

Figure 7:
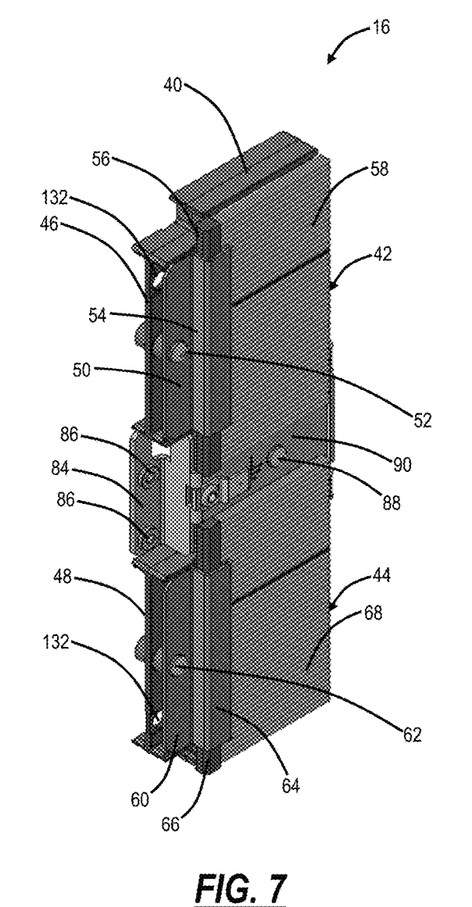
FIG. 7 is a diagram illustrating a rear outside view of a left cable gate shown in FIGS. 2 and 4, according to various embodiments of the present disclosure.
Figure 8:
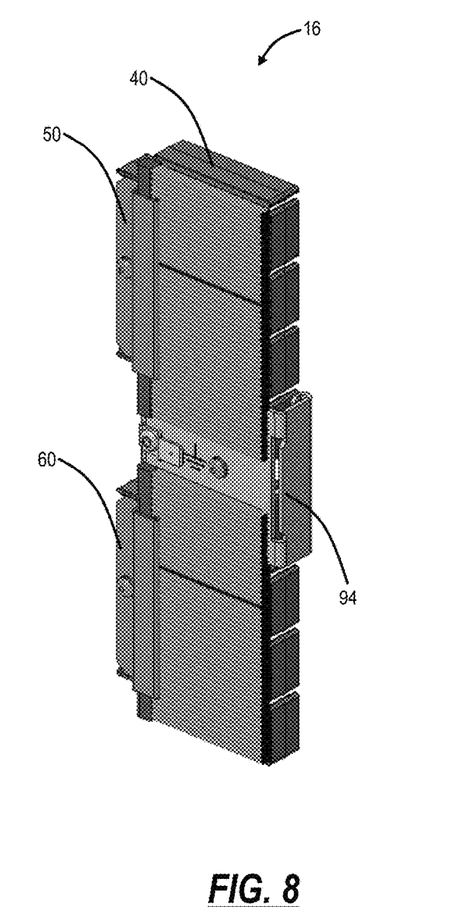
FIG. 8 is a diagram illustrating a front outside view of the left cable gate of FIG. 7.
Figure 9:
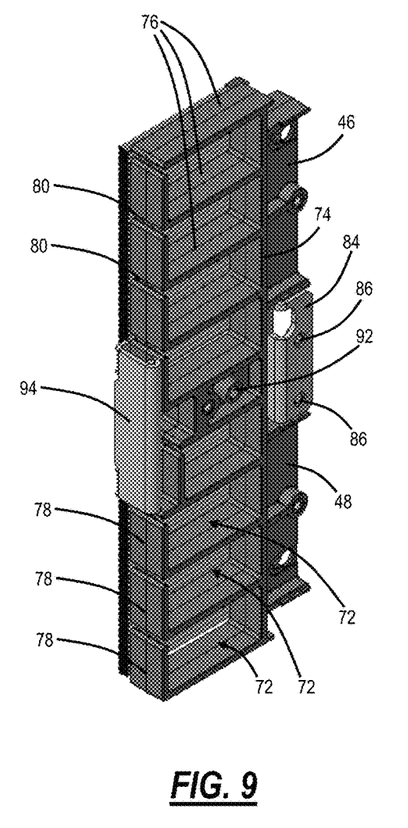
FIG. 9 is a diagram illustrating a front inside view of the left cable gate of FIG. 7.

FIGS. 7-9 depict various views of an embodiment of the left cable gate 16 before it is connected to the housing 12. FIGS. 7 and 8 illustrate a point of view of the left cable gate 16 when viewed from outside the enclosure 10. FIG. 9 shows a view of the left cable gate 16 if viewed from inside the enclosure 10. In the embodiment illustrated in FIGS. 7-9, the left cable gate 16 may include a frame 40, a top brush 42, and a bottom brush 44. The left cable gate 16 may further include an upper alignment component 46 attached to the frame 40 and a lower alignment component 48 also attached to the frame 40.

Figure 16:
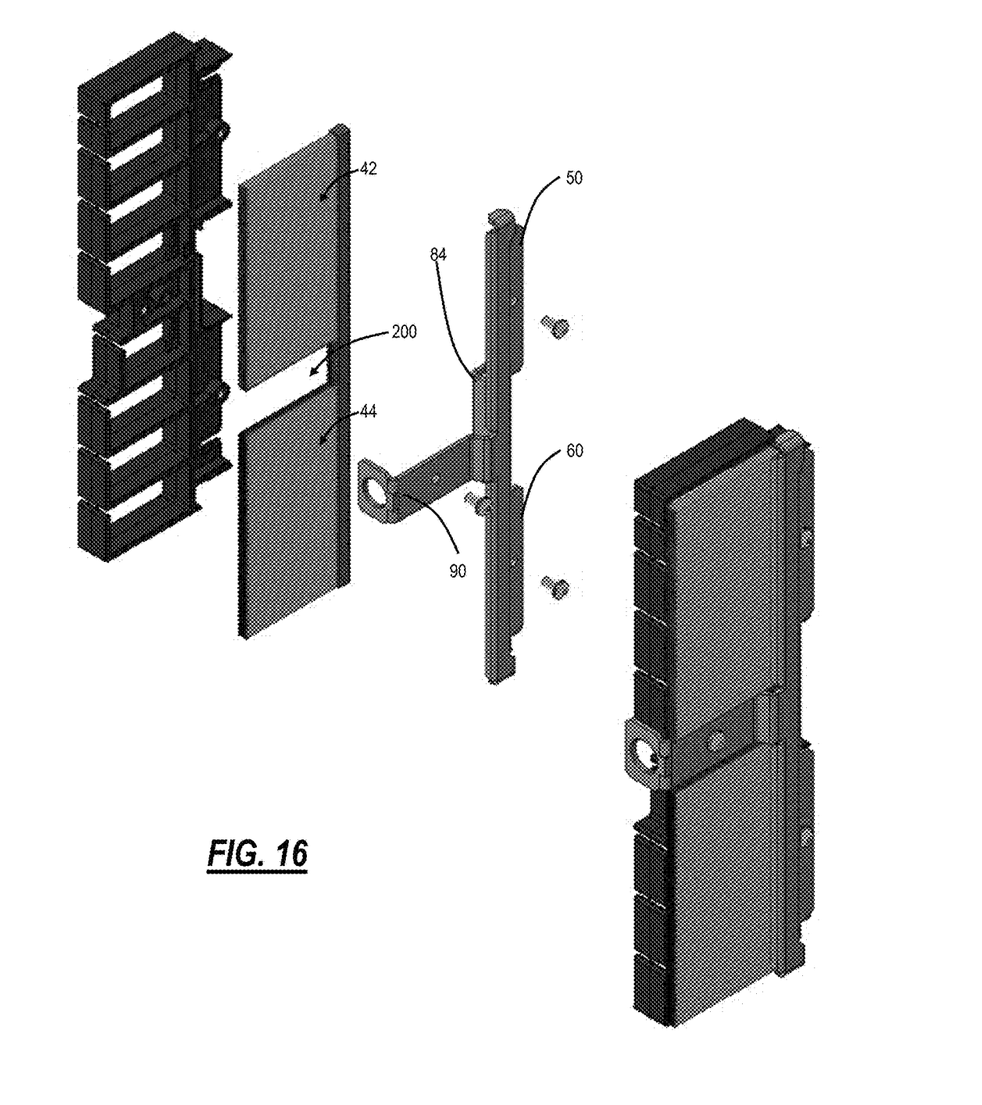
FIG. 16 is a diagram illustrating combination of various parts to reduce complexity, according to various embodiments.

A top brush brace 50 may be configured to be removably connected to the upper alignment component 46 by a screw 52 or other suitable connection elements. When connected, the top brush brace 50 is configured to support the top brush 42. For example, the top brush brace 50 may include a clip 54 configured to hold a brush head 56 of the top brush 42 in place. Bristles 58 (or strips, fibers, etc.) are supported by the brush head 56 and may consist of a flexible material. When the brush head 56 is oriented in the vertical direction (as shown in FIGS. 7 and 8), the brush head 56 may be configured to arrange the bristles 58 in a substantially horizontal orientation. In another embodiment of the configuration illustrated in FIG. 16, the top brush 42 may be combined with the bottom brush 44 into a single brush with a notch 200 in between to allow the arm 90 to pass. Similarly, the brush holder 50, the brush holder 60, and the extension arms 84, 90 can be combined into a single part.

Likewise, a bottom brush brace 60 may be configured to be removably connected to the lower alignment component 48 by a screw 62 or other suitable connection elements. When connected, the bottom brush brace 60 is configured to support the bottom brush 44. For example, the bottom brush brace 60 may include a clip 64 configured to hold a brush head 66 of the bottom brush 44 in place. Bristles 68 (or strips, fibers, etc.) are supported by the brush head 66. When the brush head 66 is oriented in the vertical direction (as shown in FIGS. 7 and 8), the brush head 66 may be configured to arrange the bristles 68 in a substantially horizontal orientation.

As shown in FIG. 9, according to various embodiments, the frame 40 may include slots 72. The slots 72 are configured to join an interior space of the housing 12 with an exterior space located outside the housing 12.

The bristles 58, 68 of the brushes 42, 44 are oriented in such a way that they cover an exterior edge portion of the frame 40 in a normal unbiased state when the brushes 42, 44 are supported by the brush braces 46, 48. The bristles 58, 68 are configured of a flexible material to allow the bristles 58, 68 to be displaced when necessary such that cables can be inserted through the frame 40. Thus, the cables can be connected to equipment inside the enclosure 10 at one end of the cables and also connected to other equipment outside the enclosure 10 at the other end of the cables. The bristles 58, 68 are configured to maintain their position to cover the slots 72 when the cables are removed.

The frame 40 may include a vertical strip 74 connected to the upper alignment component 46 and lower alignment component 48. The vertical strip 74 is also connected to horizontal strips 76 that extend in a horizontal direction from the vertical strip 74. At the other end of the horizontal strips 76, vertical segments 78 extend upward from the ends of the horizontal strips 76. Thus, the vertical strip 74, horizontal strips 76, and vertical segments 78 form the slots 72, which according to some embodiments may be rectangular.

In some embodiments, the vertical segments 78 of one slot 72 may be formed such that they do not join or contact the horizontal strips 76 of the above slots 72. In this way, the slots 72 may include a break-away feature that allows cables to be removed by pulling the cables through a gap 80 formed between the top of the vertical segment 78 and the horizontal strip 76 above that vertical segment 78. The frame 40 may include material to allow the horizontal strips 76 and vertical segments 78 to bend slightly such that the cables can be removed through the gaps 80.

The left cable gate 16 further includes a center fixture 84 that is connected to the frame 40. The center fixture 84 includes one or more openings 86 allowing hardware elements (e.g., machine screws, nuts, etc.) to connect the left cable gate 16 to the housing 12. The housing 12 may include corresponding openings such that the hardware elements can be used to connect the left cable gate 16 to the housing 12. The center fixture 84 may be connected to the frame 40 by a screw 88, where the screw 88 is configured is screwed through an opening in a support strip 90 and through a channel 92 of the frame 40 to connect the center fixture 84 to the frame 40. The center fixture 84 further includes a mounting slot 94 configured for engagement with the hook 39 (see FIG. 6) of the front cover 14.

The bristles 58, 68 may be used in a blocking condition to block air flow or in a displaced condition to allow cables to extend through the left cable gate 16. In a blocking condition, the bristles 58, 68 are configured to cover the unused slots 72 to reduce air flow between the interior space and exterior space of the housing 12 through the slot 72. In the displaced condition, the bristles 58, 68 allow one or more cables to protrude through one or more slots 72 to connect the equipment to external devices.

Figure 10:
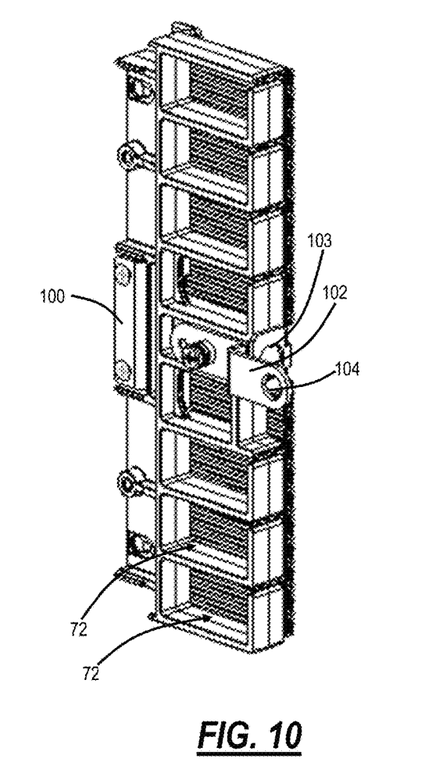
FIG. 10 is a diagram illustrating a front inside view of a right cable gate shown in FIGS. 1, 3, and 5, according to various embodiments of the present disclosure.

FIG. 10 is a view of the right cable gate 18 from an interior perspective, according to various embodiments. The right cable gate 18 may essentially include many of the same components as described above with respect to the left cable gate 18, except the elements of the right cable gate 18 are a mirror-image of the elements of the left cable gate 18. Also, the right cable gate 18 may differ from the left cable gate 18 with respect to the center fixture 100. Instead of a mounting slot (e.g., mounting slot 94 shown in FIGS. 8-9), the center fixture 100 of the right cable gate 18 may include an L-shaped bracket 102, and latch receiving hole 103. As such, when the cable gates 16, 18 and front cover 14 are installed on the housing 12, the L-shaped bracket 102 of the right cable gate 18 is configured to be inserted through the elongated aperture 38 (see FIG. 6) in the front cover 14. The L-shaped bracket 102 may include an opening 104 to allow a lock, tie, or other element to be inserted through the opening 104 to prevent the front cover 14 from being removed.

Figure 11:
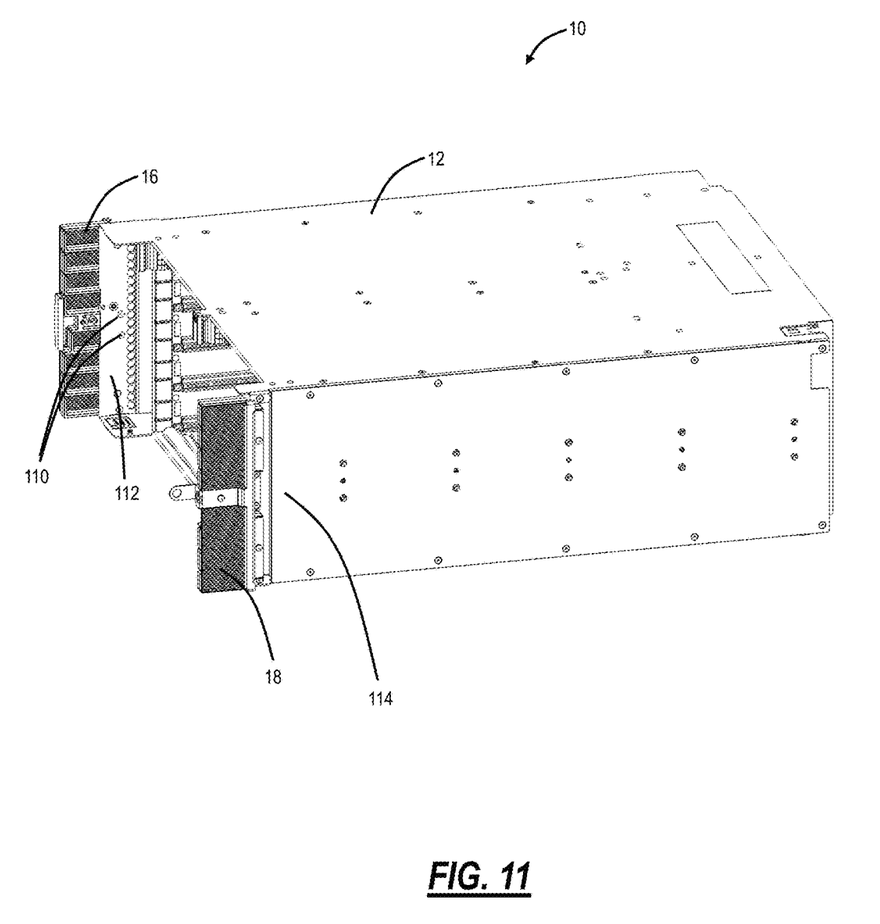
FIG. 11 is a diagram illustrating a front right view of a housing shown in FIG. 1 with the left and right cable gates connected to the housing, according to various embodiments.

FIG. 11 is a view of the front-to-rear air flow enclosure 10 with the cable gates 16, 18 attached to the housing 12. For example, a method for installing the air-flow and cable management components to the housing 12 may include a first step of attaching the cable gates 16, 18 to the housing 12 before the front cover 14 is installed. To connect the left cable gate 16, screws 110 may be screwed through openings in a left front portion 112 of the housing 12 and further inserted through the openings 86 (see FIGS. 7 and 9) in the center fixture 84 of the left cable gate 16. Similarly, screws may be inserted in openings (not shown) in a right front portion 114 of the housing 12 to connect to openings in the center fixture of the right cable gate 18.

Figure 12:
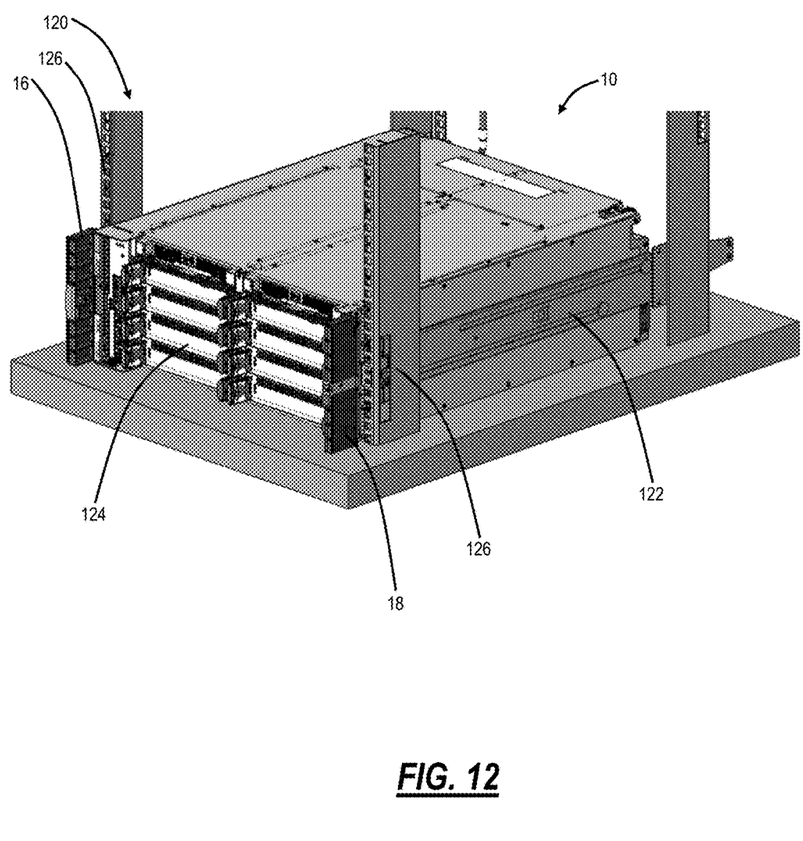
FIG. 12 is a diagram illustrating an isometric view of the housing shown in FIG. 11 connected on a shelf of a computer networking system, according to various embodiments.

FIG. 12 illustrates an exemplary environment in which the enclosure 10 may be installed. In this embodiment, the enclosure 10 may be connected to a shelf 120 or cabinet. In some embodiments, the shelf 120 may include slide components 122 to allow the enclosure 10 to slide forward with respect to the shelf 120. In this way, a user may more easily access the equipment within the enclosure 10. For example, removable packs 124 may be installed within the enclosure 10 and connected with cables. The enclosure 10 may be attached to vertical posts 126 of the shelf 120.

Figure 13:
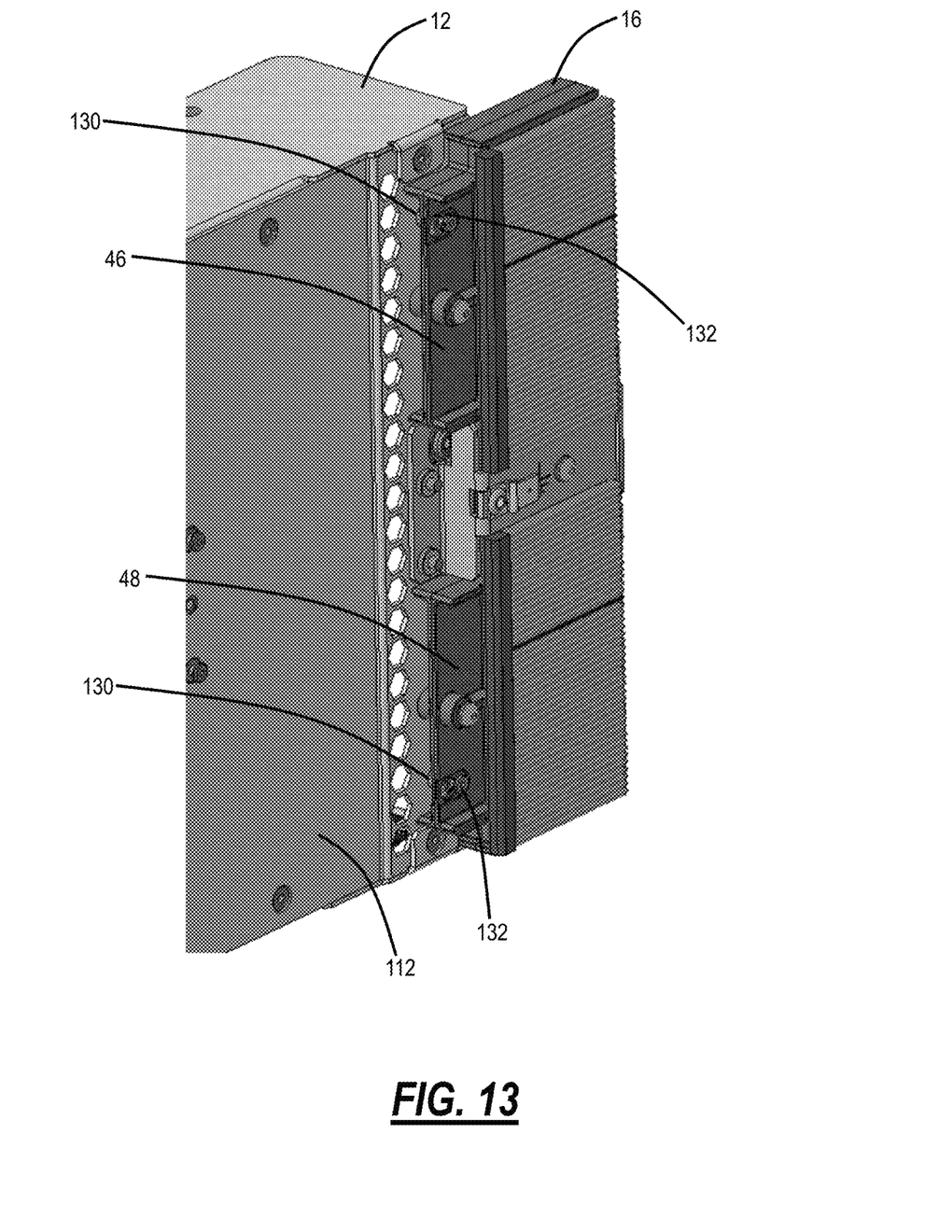
FIG. 13 is a diagram illustrating a rear outside view of the left cable gate of FIG. 7 connected to a front portion of the housing, according to various embodiments.
Figure 14:
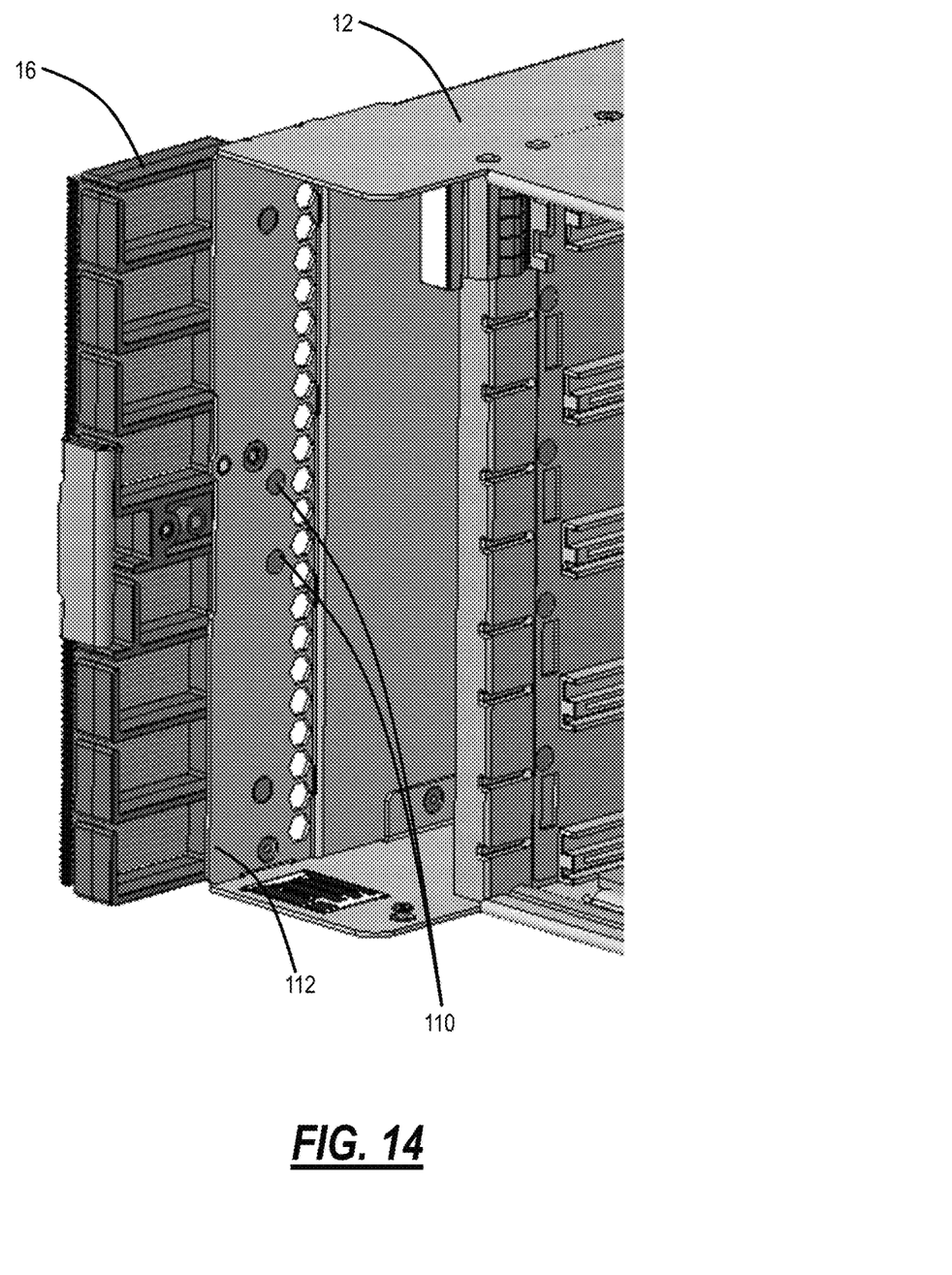
FIG. 14 is a diagram illustrating a front inside view of the left cable gate of FIG. 7 connected to the front portion of the housing.

FIGS. 13 and 14 are views showing the connection of the left cable gate 16 to the housing 12. FIG. 13 shows how the left cable gate 16 can be aligned with the left front portion 112 of the housing 12. The housing 12 includes keyhole standoffs 130 that correspond to keyholes 132 in the upper alignment component 46 and lower alignment component 48. The standoffs 130 and keyholes 132 may be configured to temporarily lock the left cable gate 16 in place before additional hardware is used to more securely connect the left cable gate 16 to the housing 12. At this first stage, the left cable gate 16 can be aligned or attached using the standoffs 130 and keyholes 132 from an outside perspective. FIG. 14 shows how the left cable gate 16 can be easily accessed from an inside position with respect to the housing 12 to securely attach the left cable gate 16 to the housing 12. The screws 110 can be used for connecting the left cable gate 16 to the left front portion 112 of the housing 12.

Figure 15:
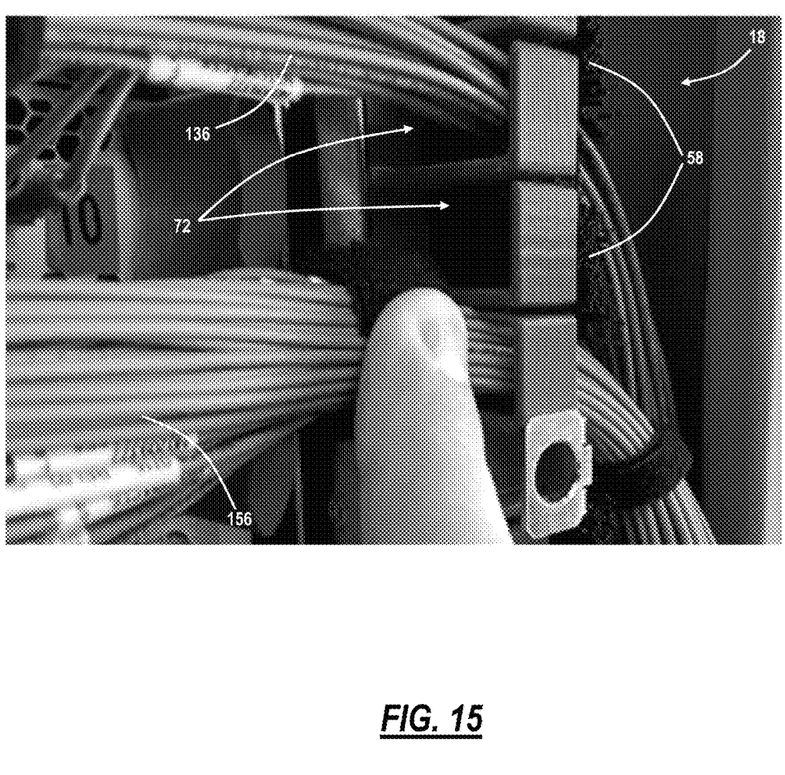
FIG. 15 is a diagram illustrating a portion of the right cable gate of FIG. 10 in use, according to various embodiments.

When a user has installed and connected the packs 124, equipment, or other electronics or mounting hardware within the enclosure 10, cables may be connected to input/output ports on the packs 124 or equipment. Therefore, ends of the cables on one side of the cables are connected to the equipment inside the enclosure 10, while the other ends may be configured for connection to equipment outside the enclosure 10, such as other enclosures installed on the shelf 120 or to other equipment installed on other shelves or elsewhere. At this time, the cable gates 16, 18 can be utilized to manage the cables such that the cables can be positioned toward the sides of the enclosure 10 (as shown in FIG. 15). As shown in FIGS. 11 and 12, the cable gates 16, 18 are positioned in a forward direction in front of the front set of vertical posts 126 of the shelf 120 such that the cable can extend through the cable gates 16, 18 without interference with the front columns 126.

The technique for installing the system may further include a step of inserting the opposite ends of the cables through the slots 72 (see FIGS. 9-10) in the left and right cable gates 16, 18 leading out to the left or right of the enclosure 10. While inserting the cables through the slots 72, it may be beneficial to insert the cables from an interior position through the slots 72 toward an exterior position. In this way, the bristles 58 may be more easily displaced to allow the cable to pass. The bristles 58 may be configured with sufficient flexibility to allow the cables to be inserted through the slots 72 with little resistance. Nevertheless, the bristles 58 may also be configured to rebound back to their original positions. For example, even when the cables are inserted through the slots 72, some bristles 58 may return to a position to block any gaps that may be formed between or around the cables. Thus, the bristles are configured to "plug" the air gaps to prevent or minimize air flow through the cable gates 16, 18 even when cables are installed therethrough.

FIG. 15 is a diagram showing the right cable gate 18 in use. As shown, cables 136 are inserted through slots 72 in the frame of the right cable gate 18. Bristles 58 are shown covering the slots 72 that are not occupied by the cables 136, whereas the bristles 58 are also shown as being displaced in the slots 72 where the cables 136 are inserted.

By allowing the cables to be inserted through the slots 72 of the cable gates 16, 18 and by filling the remaining gaps around the cables with the bristles, the cables are allowed to exit the enclosure 10 without creating large spaces where air can flow. Thus, the majority of air flow will be through the front cover 14 and will be filtered by the air filter 32. Also, the bristles 58, 68 may form a type of air filter themselves.

The bristles 58, 68 may be arranged in bunches having a width that is wider than the width of each individual bristle 58, 68. For example, similar to a brush element of a broom, the bristles 58 may be arranged adjacent to each other to adequately cover the gaps on the exterior edge of the frame of the cable gates 16, 18 and to include back-up positioning for several layers of air blockage.

As illustrated in the present disclosure, the bristles 58, 68 may be arranged in a horizontal direction. In alternative embodiments, the bristles 58, 68 may be arranged at different angles. For example, a first layer of bristles may be oriented at a first angle (e.g., about 10-20 degrees below a zero-degree horizontal line), a second layer of bristles may be oriented at a second angle (e.g., about zero-degrees), and a third layer of bristles may be oriented at a third angle (e.g., about 10-20 degrees above the zero-degree horizontal line). Other arrangements and other angles may be used to position the bristles 58, 68 with respect to the slots 72.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A system for managing cables comprising:
   a housing configured to support equipment and having a front-to-rear air-cooling apparatus for cooling the equipment;
   a front cover removably connected to the housing and including a plurality of perforations for air flow in the front-to-rear air-cooling apparatus;
   at least one cable gate formed at a side portion of the housing, each of the at least one cable gate including a frame having at least one slot joining an interior space of the housing with an exterior space located outside the housing, each of the at least one cable gate including at least one brush having a plurality of bristles, each of the at least one cable gate is located between the housing and the front cover, and the interior space is defined by the housing, the front cover, and the at least one cable gate;
   wherein, in a blocking condition, the bristles of each cable gate are configured to cover the at least one slot of the respective cable gate to reduce air flow between the interior space and exterior space through the at least one slot; and
   wherein, in a displaced condition, the bristles of each cable gate are configured to allow one or more cables to protrude through one or more slots of the at least one slot of the respective cable gate to enable the equipment to be connected with external devices, wherein the bristles further reduce the air flow between the interior space and exterior space with the one or more cables inserted therein, such that the interior space in the housing has the front-to-rear air-cooling apparatus with air flow via the plurality of perforations in both the blocking condition and the displaced condition.

2. The system of claim 1, wherein the front cover includes a vertical panel, a top extension, and a bottom extension, the top extension configured to extend in a rearward direction from a top edge of the vertical panel, and the bottom extension configured to extend in the rearward direction from a bottom edge of the vertical panel.

3. The system of claim 1, wherein the frame of the at least one cable gate includes one of a top brush and a bottom brush.

4. The system of claim 1, wherein, in the displaced condition, a combinations of the one or more cables and the bristles are collectively configured to reduce air flow between the interior space and exterior space through the at least one slot.

5. The system of claim 1, wherein each cable gate includes at least one brush brace connected to the frame, each brush brace configured to support a respective brush.

6. The system of claim 1, wherein the housing is mounted on a shelf of a networking system.

7. The system of claim 1, wherein the housing is a pizza-box type housing.

8. The system of claim 1, wherein the housing is configured to support removeable circuit packs having input and outputs for connection with a first end of the cables, the cables extending through the slots such that a second end of the cables is connectable to equipment external to the housing.

9. The system of claim 1, wherein the system is configured for installation in a data center setting and a central office setting.

10. The system of claim 1, wherein the front cover further includes an air filter connected to an inside surface of the vertical panel to filter air flowing through the perforations.

11. The system of claim 2, wherein a gap is formed between a top end of each of the vertical segments and a horizontal strip positioned above the respective vertical segment to create a break-away feature.

12. The system of claim 2, further comprising a center fixture connected to the vertical strip of the frame, the center fixture configured for removably attaching the cable gate to a front edge of the housing.

* * * * *